US012429176B2

(12) United States Patent
Jiang et al.

(10) Patent No.: US 12,429,176 B2
(45) Date of Patent: Sep. 30, 2025

(54) LIGHTING APPARATUS

(71) Applicant: LEEDARSON LIGHTING CO., LTD., Fujian (CN)

(72) Inventors: Hongkui Jiang, Fujian (CN); Yusheng Lin, Fujian (CN)

(73) Assignee: LEEDARSON LIGHTING CO., LTD., Zhangzhou (CN)

( * ) Notice: Subject to any disclaimer, the term of this patent is extended or adjusted under 35 U.S.C. 154(b) by 6 days.

(21) Appl. No.: 18/222,572

(22) Filed: Jul. 17, 2023

(65) Prior Publication Data
US 2024/0019087 A1    Jan. 18, 2024

(30) Foreign Application Priority Data
Jul. 15, 2022  (CN) .......................... 202221834204.1

(51) Int. Cl.
*F21K 9/238*   (2016.01)
*F21V 9/40*    (2018.01)

(52) U.S. Cl.
CPC ............... *F21K 9/238* (2016.08); *F21V 9/40* (2018.02)

(58) Field of Classification Search
CPC .................................. F21K 9/238; F21V 9/40
USPC ............................................................. 362/84
See application file for complete search history.

(56) References Cited

U.S. PATENT DOCUMENTS

| 2016/0204090 | A1* | 7/2016 | Lu ........................ H01L 33/62 257/98 |
| 2017/0084809 | A1* | 3/2017 | Jiang ..................... H01L 33/56 |
| 2018/0100624 | A1* | 4/2018 | Bergenek ............... F21K 9/232 |
| 2020/0217460 | A1* | 7/2020 | Park ....................... F21K 9/232 |

* cited by examiner

*Primary Examiner* — James R Greece
*Assistant Examiner* — Hana S Featherly
(74) *Attorney, Agent, or Firm* — LANWAY IPR SERVICES; Chun-Ming Shih

(57) ABSTRACT

A lighting apparatus includes a first lead terminal, a second lead terminal, a substrate, multiple semiconductor light chips and a molding module. The substrate has wiring layer. The wiring layer is composed one or multiple metal wires, metal strips or other electrical conductive patterns on the substrate. The multiple semiconductor light chips are mounted on a bridge part of the substrate. The first lead terminal and the second lead terminal are attached on opposite sides of the bridge part. The multiple semiconductor light chips are electrically connected to the first lead terminal and the second lead terminal via the wiring layer. The molding module is mixed with fluorescent material enclosing the bridge part of the substrate and the multiple semiconductor light chips.

14 Claims, 5 Drawing Sheets

LIGHTING APPARATUS

FIELD

The present invention is related to a lighting apparatus, and more particularly related to a lighting apparatus with light strips.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various types of lighting apparatuses. When cost and light efficiency of LED have shown great effect compared with traditional lighting devices, people look for even better light output. It is important to recognize factors that can bring more satisfaction and light quality and flexibility.

The demand for new style of light devices is increasing. Such needs occur in different light device types. For example, people may expect a light bulb not only uses LED technology but also appear great, e.g. for decoration purpose or to creating nice light effect.

However, it takes time to design components to produce nice result. Cost is also a factor that needs to be considered.

Therefore, it is beneficial to design a lighting apparatus and components for providing a better light devices to the world.

SUMMARY

In some embodiments, a lighting apparatus includes a first lead terminal, a second lead terminal, a substrate, multiple semiconductor light chips and a molding module.

The substrate has a wiring layer. The wiring layer is composed one or multiple metal wires, metal strips or other electrical conductive patterns on the substrate.

The multiple semiconductor light chips are mounted on a bridge part of the substrate. In some embodiments, the bridge part is the middle part of the substrate.

The first lead terminal and the second lead terminal are attached on opposite sides of the bridge part.

The multiple semiconductor light chips are electrically connected to the first lead terminal and the second lead terminal via the wiring layer.

The molding module is mixed with fluorescent material enclosing the bridge part of the substrate and the multiple semiconductor light chips.

A light parameter emitted from one semiconductor light chip is adjusted when passing through the fluorescent material. In other words, the fluorescent material converts the light characteristics, e.g. to change color, color temperature or other features, based on material types.

In some embodiments, the substrate is an elongated bar.

In some embodiments, a width of the semiconductor light chip is smaller than 200 μm.

In some embodiments, a light transmittance of the substrate is larger than 20%.

In some embodiments, at least one of the semiconductor light chips is placed on a first side of the substrate.

A portion of light emitted by said one of the semiconductor light chips passes through the substrate to a second side of the substrate.

The first side and the second side are opposite sides of the substrate.

A portion of the light emitting by a semiconductor light chip on a first side of the substrate is moving upwardly. Some portion of the light emitted by the semiconductor light chip passes through the substrate to the second side of the substrate.

In some embodiments, at least another of the semiconductor chips is placed on the second side of the substrate.

In some embodiments, said one of the semiconductor light chips and said another of the semiconductor light chips are placed with a non-overlapping placement.

In some embodiments, a output light outwardly from the first side of the substrate includes both lights of said one of the semiconductor light chips and said another of the semiconductor light chips.

In some embodiments, a first type of fluorescent material is placed upon the first side of substrate.

A second type of fluorescent material is placed upon the second side of the substrate.

The first type of fluorescent material is different from the second type of the fluorescent material.

The first side and the second side of the substrate may be covered with same or different fluorescent type. A simulation result may be applied to determine what types of fluorescent material to be used to achieve a required overall light pattern.

In some embodiments, the substrate is flexible so as to be deformed when applying an external force.

In some embodiments, a distance between two semiconductor light chips is less than 3 mm.

In some embodiments, the fluorescent material contains particles.

The diameter of the particles are substantially less then 10 μm.

In some embodiments, the average diameter of the particles are less than 3 μm

In some embodiments, the first lead terminal includes a flexible sheet mounted with multiple metal strips for transmitting electricity signals.

In some embodiments, a driver circuit is disposed on the flexible sheet.

In some embodiments, an antenna is formed on the flexible sheet.

In some embodiments, the flexible sheet has a reflectivity larger than 60%.

In some embodiments, the flexible sheet has a larger reflectivity for light frequency between 420 nm and 550 nm larger than other light frequency.

In some embodiments, the lighting apparatus may also include a bulb housing a bulb shell.

The bulb housing is used for containing a driver module for electrically coupled to the first lead terminal and the second lead terminal to generate driving currents to the semiconductor light chips.

The semiconductor light chips emit light passing through the bulb shell.

The bulb housing and the bulb shell define a concealed space for containing the semiconductor light chips.

Oxygen is more than 1% of all gas in the concealed space.

In some embodiments, helium is mare than 90% of all gas in the concealed space.

DETAILED DESCRIPTION

In some embodiments, a lighting apparatus includes a first lead terminal 601, a second lead terminal 602, a substrate 603, multiple semiconductor light chips 6041, 6042, 6043 and a molding module 605.

The first lead terminal 601 and the second lead terminal 602 are interface for electrically connecting components on the substrate 603 to external electrical power, e.g. driving currents and/or control signals, and/or components, like driver module.

The molding module 605 may be glued to attach to the substrate 603, or may be deformed under heating into glue to attach to the substrate 603. When the heat is removed, the molding module 605 is harden to a fixed shape enclosing the semiconductor light chips.

The semiconductor chips 6041, 6042, 6043 are preferably die chips not being packaged yet. The die chips are semiconductor devices cutting from a semiconductor waver with basic padding or wiring points to connect to other devices. Unlike common integrated chips, the die chips have smaller size with external protection package.

The molding module 605 serves as a protection structure to protect the die chips when enclosing the semiconductor light chips 6041, 6042, 6043.

The substrate 603 has a wiring layer 6031. The wiring layer 6031 is composed one or multiple metal wires, metal strips or other electrical conductive patterns on the substrate.

Figure 5:
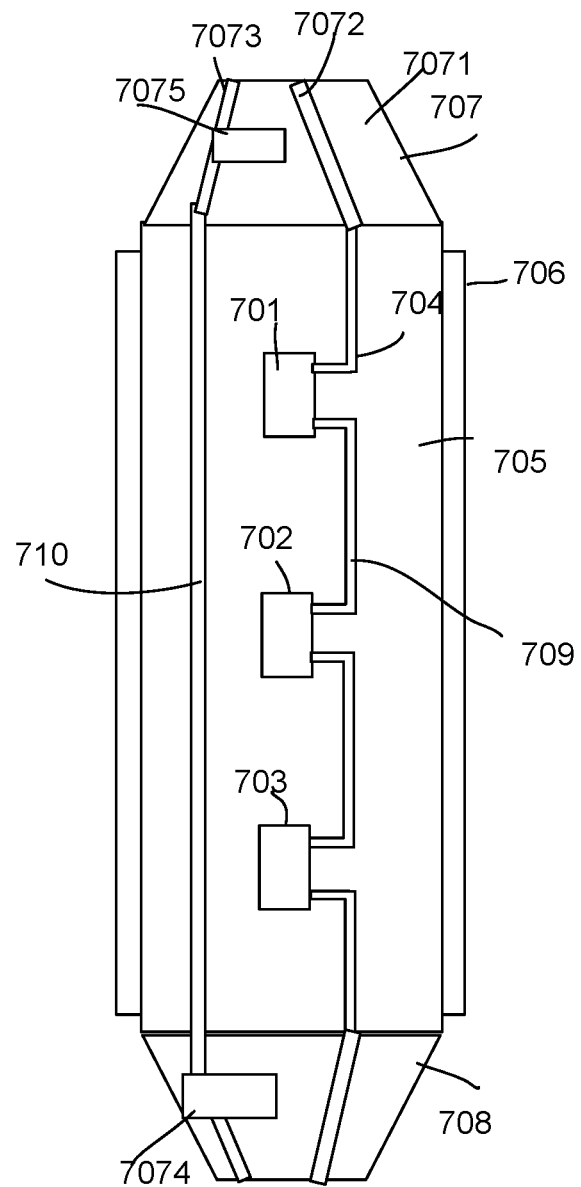
FIG. 5 shows a top view of another embodiment.

In FIG. 5, the three semiconductor light chips 701, 702, 703 are connected in series through a first wire 704.

The multiple semiconductor light chips 701, 702, 703 are mounted on a bridge part 705 of the substrate 706. In some embodiments, the bridge part 705 is the middle part of the substrate 706.

The first lead terminal 707 and the second lead terminal 708 are attached on opposite sides of the bridge part 705.

The multiple semiconductor light chips 701, 702, 703 are electrically connected to the first lead terminal 707 and the second lead terminal 708 via a first wire 704 of the wiring layer 709. The wiring layer 709 may be made by etching a metal layer to form a metal strip pattern for conducting electricity to components like the semiconductor light chips 701, 702, 703 on the substrate 706. In the example of FIG. 5, a second wire 710 is also placed on the wiring layer 709 for building another electrical path.

Figure 4:
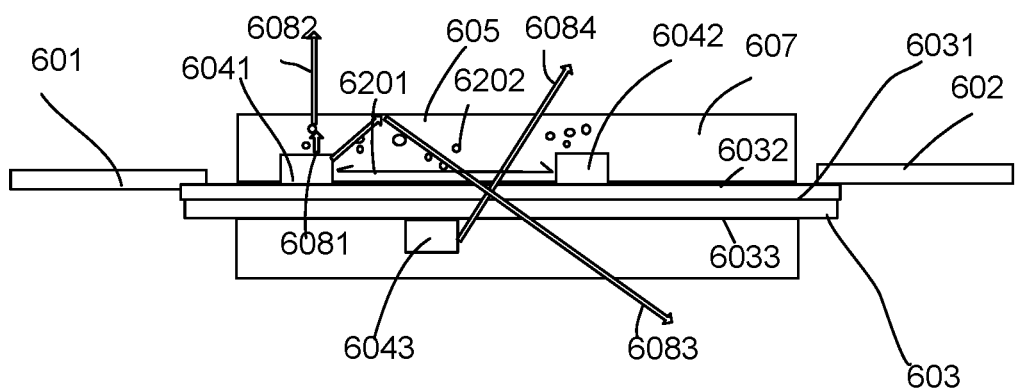
FIG. 4 shows an embodiment of a lighting apparatus.

As shown in FIG. 4, the molding module 604 is mixed with fluorescent material 607 enclosing the bridge part of the substrate 603 and the multiple semiconductor light chips 6041, 6042, 6043.

A light parameter emitted from one semiconductor light chip is adjusted when passing through the fluorescent material. In other words, the fluorescent material converts the light characteristics, e.g. to change color, color temperature or other features, based on material types.

For example, the light 6081 escaped from the semiconductor light chip 6041 is transformed by the fluorescent material in the molding module 605 to change to another light 6082 of another parameter.

In FIG. 4, the substrate 603 is an elongated bar. In some preferred embodiment, the width of the elongated bar is smaller than 1/10 of the length of the substrate.

In some embodiments, a width of the semiconductor light chip is smaller than 200 μm.

In some embodiments, a light transmittance of the substrate is larger than 20%. In other words, some light from the semiconductor light chip 6041 mounted on a first side 6032 of the substrate may pass through the substrate 603 as the light 6083.

In FIG. 4, there are two semiconductor light chips 6041, 6042 placed on a first side 6032 of the substrate 603.

A portion of light 6083 emitted by said one of the semiconductor light chips passes through the substrate 603 to a second side 6033 of the substrate 603.

The first side 6032 and the second side 6033 are opposite sides of the substrate 603.

A portion of the light, like the light 6082 emitting by a semiconductor light chip 6041 on a first side 6032 of the substrate 603 is moving upwardly. Some portion, the light 6083 emitted by the semiconductor light chip 6041 passes through the substrate 613 to the second side 6033 of the substrate 603.

In some embodiments, at least another of the semiconductor chips, e.g. the semiconductor light chip 6043 is placed on the second side 6033 of the substrate 603.

In some embodiments, said one of the semiconductor light chips, e.g. the semiconductor chip 6041, and said another of the semiconductor light chips, e.g. the semiconductor chip 6043, are placed with a non-overlapping placement. For example, FIG. 4 shows that the semiconductor light chips 6041, 6043 are not overlapped on opposite sides of the substrate 603.

In some embodiments, a output light outwardly from the first side of the substrate 603 includes both lights of said one of the semiconductor light chips and said another of the semiconductor light chips. For example, the light 6082 from the semiconductor light chip 6041 and the light 6084 from the semiconductor light chip 6043 both escape upwardly from the first side 6032 of the substrate 603.

In some embodiments, a first type of fluorescent material is placed upon the first side of substrate.

A second type of fluorescent material is placed upon the second side of the substrate.

The first type of fluorescent material is different from the second type of the fluorescent material.

Such arrangement makes different fluorescent layers causing different light effect, even the same semiconductor light chips are uses on the lighting apparatus.

The first side and the second side of the substrate may be covered with same or different fluorescent type. A simulation result may be applied to determine what types of fluorescent material to be used to achieve a required overall light pattern.

Engineers may collect color and other light parameters of different fluorescent materials and find an optimized light effect. In the experiments, it is found that in some embodiments, the substrate with different fluorescent layers on two sides make great visual effect, which is not apparent but great, away from obvious field.

In some embodiments, the substrate is flexible so as to be deformed when applying an external force. For example, users may use bracket to fix the substrate while bending the substrate to a desired curvature.

In some embodiments, a distance 6201 between two semiconductor light chips 6041, 6042 is less than 3 mm.

In some embodiments, the fluorescent material contains particles 6202.

The diameter of the particles are substantially less then 10 μm.

In some embodiments, the average diameter of the particles are less than 3 μm. In FIG. 5, the first lead terminal includes a flexible sheet 7071 mounted with multiple metal strips 7072, 7073, for transmitting electricity signals.

In some embodiments, a driver circuit 7074 is disposed on the flexible sheet.

In some embodiments, an antenna 7075 is formed on the flexible sheet 7071.

In some embodiments, the flexible sheet 7071 has a reflectivity larger than 60%, for reflecting any light on it to increase light efficiency. Reflecting material may be applied on surface of the flexible sheet 7071.

In some embodiments, the flexible sheet 7071 has a larger reflectivity for light frequency between 420 nm and 550 nm larger than other light frequency. In other words, the reflective factor is particularly better for lights between the range mentioned above. It is found such arrangement is very helpful while preventing heat accumulation.

Figure 2:
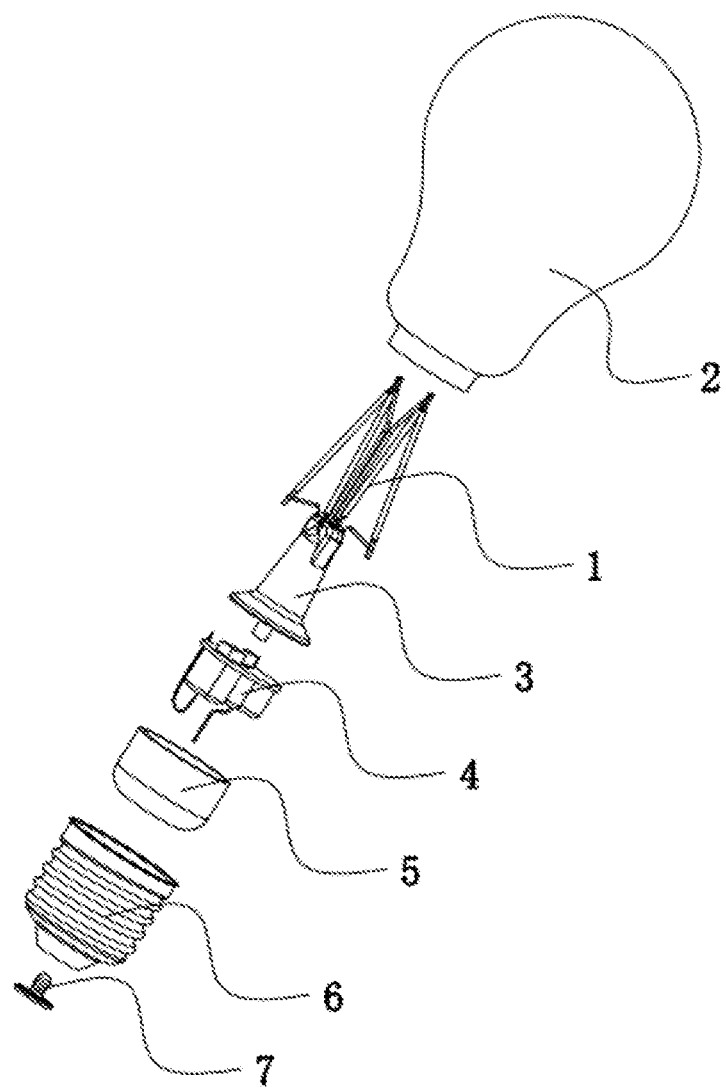
FIG. 2 illustrates an explosive diagram of a light bulb.
Figure 3:
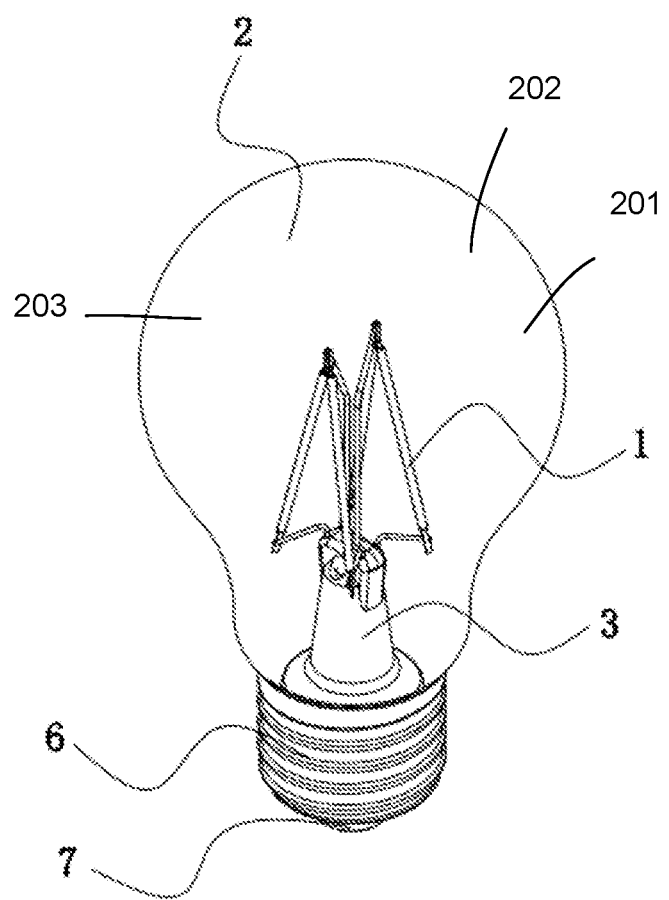
FIG. 3 illustrates a perspective view of a light bulb using light strips.

In FIG. 2 and FIG. 3, the lighting apparatus is a light bulb and may also include a bulb housing 6 and a bulb shell 2.

The bulb housing 6 is used for containing a driver module 4 for electrically coupled to the first lead terminal and the second lead terminal to generate driving currents to the semiconductor light chips, as mentioned above.

The semiconductor light chips emit light passing through the bulb shell 2.

The bulb housing 6 and the bulb shell 2 define a concealed space 201 for containing the semiconductor light chips.

Oxygen 202 is more than 1% of all gas in the concealed space.

In some embodiments, helium 203 is mare than 90% of all gas in the concealed space 201.

In FIG. 2, the light bulb device has multiple light strips which may use the component mentioned above and are fixed on a bracket. There is a glass column 3 for forming the concealed space mentioned above with the bulb shell 2. There is also a heat dissipation cup 4 and an electric terminal 7 that is used for guiding external power to the driver module 4.

Figure 1:
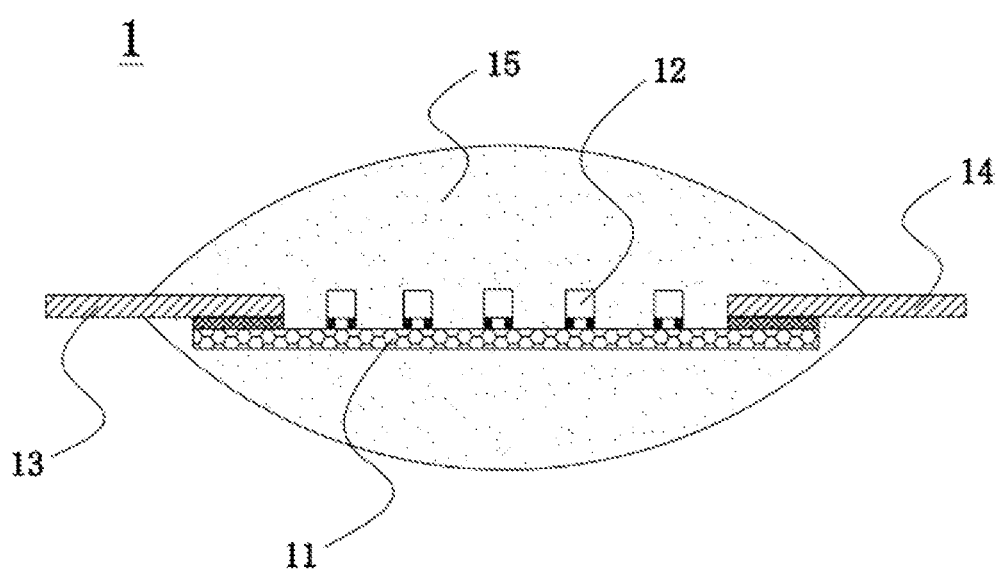
FIG. 1 illustrates a light strip example.

FIG. 1 shows a light strip 1. The light strip has a first lead frame 13 and a second lead frame 14. There is a molding module 15 containing fluorescent material to cover multiple semiconductor light chips 12 that are mounted on a substrate 11.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus, comprising:
   a first lead terminal;
   a second lead terminal;

a substrate with a wiring layer;

multiple semiconductor light chips mounted on a bridge part of the substrate, wherein the first lead terminal and the second lead terminal are attached on opposite sides of the bridge part, wherein the multiple semiconductor light chips are electrically connected to the first lead terminal and the second lead terminal via the wiring layer; and a molding module mixed with fluorescent material enclosing the bridge part of the substrate and the multiple semiconductor light chips, wherein a light parameter emitted from one semiconductor light chip is adjusted when passing through the fluorescent material, wherein a light transmittance of the substrate is larger than 20%, wherein at least one of the semiconductor light chips is placed on a first side of the substrate, wherein a portion of light emitted by said one of the semiconductor light chips passes through the substrate to a second side of the substrate, wherein the first side and the second side are opposite sides of the substrate, wherein at least another of the semiconductor chips is placed on the second side of the substrate, wherein said one of the semiconductor light chips and said another of the semiconductor light chips are placed with a non-overlapping placement, wherein the first lead terminal comprises a flexible sheet mounted with multiple metal strips for transmitting electricity signals, wherein the flexible sheet has a larger reflectivity for light frequency between 420 nm and 550 nm larger than other light frequency.

2. The lighting apparatus of claim 1, wherein the substrate is an elongated bar.

3. The lighting apparatus of claim 1, wherein a width of the semiconductor light chip is smaller than 200 μm.

4. The lighting apparatus of claim 1, wherein an output light outwardly from the first side of the substrate comprises both lights of said one of the semiconductor light chips and said another of the semiconductor light chips.

5. The lighting apparatus of claim 1, wherein a first type of fluorescent material is placed upon the first side of substrate, wherein a second type of fluorescent material is placed upon the second side of the substrate, wherein the first type of fluorescent material is different from the second type of the fluorescent material.

6. The lighting apparatus of claim 1, wherein the substrate is flexible so as to be deformed when applying an external force.

7. The lighting apparatus of claim 1, wherein a distance between two semiconductor light chips is less than 3 mm.

8. The lighting apparatus of claim 1, wherein the fluorescent material contains particles, wherein the diameter of the particles are substantially less then 10 μm.

9. The lighting apparatus of claim 8, wherein the average diameter of the particles are less than 3 μm.

10. The lighting apparatus of claim 1, wherein a driver circuit is disposed on the flexible sheet.

11. The lighting apparatus of claim 1, wherein an antenna is formed on the flexible sheet.

12. The lighting apparatus of claim 1, wherein the flexible sheet has a reflectivity larger than 60%.

13. The lighting apparatus of claim 1, further comprising a bulb housing a bulb shell, wherein the bulb housing is used for containing a driver module for electrically coupled to the first lead terminal and the second lead terminal to generate driving currents to the semiconductor light chips, wherein the semiconductor light chips emit light passing through the bulb shell, wherein the bulb housing and the bulb shell define a concealed space for containing the semiconductor light chips, wherein oxygen is more than 1% of all gas in the concealed space.

14. The lighting apparatus of claim 13, wherein helium is more than 90% of all gas in the concealed space.

* * * * *